(12) United States Patent
Sawada

(10) Patent No.: US 8,389,951 B2
(45) Date of Patent: Mar. 5, 2013

(54) SPHERICAL ABERRATION CORRECTOR AND METHOD OF SPHERICAL ABERRATION CORRECTION

(75) Inventor: Hidetaka Sawada, Tokyo (JP)

(73) Assignee: JEOL Ltd., Tokyo (JP)

( * ) Notice: Subject to any disclaimer, the term of this patent is extended or adjusted under 35 U.S.C. 154(b) by 136 days.

(21) Appl. No.: 13/108,207

(22) Filed: May 16, 2011

(65) Prior Publication Data
US 2011/0284758 A1 Nov. 24, 2011

(30) Foreign Application Priority Data
May 18, 2010 (JP) .................................. 2010-114373

(51) Int. Cl.
*H01J 37/153* (2006.01)
(52) U.S. Cl. .............................. 250/396 R; 250/396 ML
(58) Field of Classification Search .............. 250/396 R, 250/396 ML
See application file for complete search history.

(56) References Cited

U.S. PATENT DOCUMENTS

| | | | |
|---|---|---|---|
| 6,548,816 B2 * | 4/2003 | Hosokawa | 250/396 ML |
| 6,770,887 B2 * | 8/2004 | Krivanek et al. | 250/396 R |
| 7,800,074 B2 * | 9/2010 | Uhlemann | 250/396 R |
| 7,800,076 B2 * | 9/2010 | Uhlemann et al. | 250/396 R |
| 2002/0121609 A1 * | 9/2002 | Hosokawa | 250/396 ML |
| 2004/0227099 A1 * | 11/2004 | Matsuya | 250/398 |
| 2007/0181806 A1 * | 8/2007 | Nakano et al. | 250/310 |
| 2010/0072387 A1 * | 3/2010 | Sawada et al. | 250/396 ML |

FOREIGN PATENT DOCUMENTS

JP 2009054565 A 3/2009

OTHER PUBLICATIONS

A.V. Crewe and D. Kopf, "A sextupole system for the correction of spherical aberration", Optik, (1980), pp. 1-10, vol. 55, No. 1.
H. Rose, "Outline of a spherically corrected semiaplanatic medium-voltage transmission electron microscope", Optik, (1990), pp. 19-24, vol. 85, No. 1.
H. Muller et al., "Advancing the Hexapole Cs-Corrector for the Scanning Transmission Electron Microscope", Microsc. Microanal., (2006), pp. 442-455, vol. 12.

* cited by examiner

*Primary Examiner* — Michael Logie
(74) *Attorney, Agent, or Firm* — The Webb Law Firm

(57) ABSTRACT

A spherical aberration corrector and method is offered, which is easy to design and which can correct spherical aberration and even six-fold astigmatism in a charged particle beam instrument. The corrector has a first pair of multipole elements for producing a first pair of three-fold symmetric fields in which three-fold astigmatisms produced mutually are canceled out and a second pair of multipole elements for producing a second pair of three-fold symmetric fields in which three-fold astigmatisms produced mutually are canceled out. The second pair of multipole elements produce six-fold astigmatisms angularly spaced by 30° about an optical axis from six-fold astigmatisms produced by the first pair of multipole elements.

13 Claims, 3 Drawing Sheets

PRIOR ART

SPHERICAL ABERRATION CORRECTOR AND METHOD OF SPHERICAL ABERRATION CORRECTION

BACKGROUND OF THE INVENTION

1. Field of the Invention

The present invention relates to a spherical aberration corrector and a method of spherical aberration correction and, more particularly, to a spherical aberration corrector and spherical aberration correction method capable of correcting even six-fold astigmatisms by utilizing three-fold symmetric fields.

2. Description of the Related Art

In a charged particle beam instrument such as a transmission electron microscope (TEM) or scanning transmission electron microscope (STEM), aberration correction is an essential technique for obtaining high spatial resolution. Especially, positive spherical aberration produced by an objective lens that is an axisymmetric lens is a main factor limiting improvement of spatial resolution.

Today, it is widely known that this positive spherical aberration can be corrected by the use of negative spherical aberration produced by hexpole elements A. V. Crewe and D. Kopf, *Optik*, Vol. 55 (1980), pp. 1-10 and H. Rose, *Optik*, Vol. 85 (1990), pp. 19-24. H. Rose, *Optik*, Vol. 85 (1990), pp. 19-24 propose a spherical aberration corrector using such hexpole elements. The corrector disclosed in this non-patent document is equipped with two hexpole elements.

Referring to FIG. 5, a spherical aberration corrector disclosed in H. Rose, *Optik*, Vol. 85 (1990), pp. 19-24 is indicated by numeral 100 and equipped in a transmission electron microscope having an objective lens 101. The corrector 100 is mounted ahead of the objective lens 101 (i.e., mounted in the illumination system) as shown in FIG. 5 or behind the objective lens 101 (i.e., mounted in the projection system). This corrector 100 has hexapole elements 102 and 103 located on the optical axis 120, a first pair of transfer lenses 104 and 105 mounted between the hexapole elements 102 and 103, and a second pair of transfer lenses 104 and 105 mounted between the hexapole element 103 and the objective lens 101. The two stages of hexapole elements 102 and 103 are so arranged that they are coincident as viewed along the optical axis 120. That is, three-fold symmetric fields created respectively by the hexapole elements 102 and 103 bear no rotational relationship to each other about the optical axis 120. Each pair of transfer lenses 104 and 105 is made of two axisymmetric lenses. The transfer lenses 104 and 105 located between the hexapole elements 102 and 103 form, in the position of the other hexapole element 103, an image conjugate with an image formed by the hexapole element 102. The transfer lenses 104 and 105 located between the hexapole element 103 and the objective lens 101 form, in a coma-free plane 101a of the objective lens 101, an image conjugate with an image formed by the hexapole element 103. An electron beam 121 incident on the coma-free plane 101a is focused on a surface 101b of a sample.

The two stages of hexapole elements 102 and 103 produce negative spherical aberrations in mutually perpendicular directions with respect to the electron beam 121 and, therefore, the two stages of hexapole elements 102, 103 and the first pair of transfer lenses 104 and 105 cooperate to form isotropic negative spherical aberration with respect to the optical axis 120. The two stages of hexapole elements 102 and 103 act as a so-called concave lens. This negative spherical aberration suppresses the positive spherical aberration in the objective lens 101 that is a so-called convex lens.

It is generally known that a hexapole element produces three-fold astigmatism which is a second-order aberration. Accordingly, in the corrector 100 of H. Rose, *Optik*, Vol. 85 (1990), pp. 19-24, the three-fold astigmatism in the hexapole element 103 cancels the three-fold astigmatism in the hexapole element 102.

The aforementioned aberration correction technique can suppress the three-fold astigmatism but correct only up to the fourth-order aberration. This technique cannot completely correct still higher-order aberrations. In the above-described spherical aberration corrector, a six-fold astigmatism that is one fifth-order aberration appears in return for cancellation of the three-fold astigmatism produced by each three-fold symmetric field. Because this is a factor restricting the aberration correction, further improvement of spatial resolution cannot be anticipated.

In view of this problem, JP-A-2009-054565 discloses a spherical aberration corrector capable of correcting the six-fold astigmatism. In particular, three stages of multipole elements for producing 3 three-fold symmetric fields are arranged about the optical axis so as to be angularly spaced from each other by a given angle, thus suppressing the six-fold astigmatism.

H. Müller et al., *Microsc., Microanal.*, Vol. 12 (2006), pp. 442-455 shows the results of a theoretical analysis of a spherical aberration corrector capable of correcting the six-fold astigmatism, and proposes a spherical aberration corrector having two stages of hexapole elements and pairs of transfer lenses in the same way as H. Rose, *Optik*, Vol. 85 (1990), pp. 19-24. According to the results of the analysis, in a case where an excitation current is applied to each hexapole element to maintain constant the third-order spherical aberration, the six-fold astigmatism is minimized when the length of each hexapole element taken along its optical axis assumes a certain value.

As described previously, the spherical aberration correctors disclosed in JP-A-2009-054565 and H. Müller et al., *Microsc., Microanal.*, Vol. 12 (2006), pp. 442-455, suppress six-fold astigmatism using three-fold symmetric fields. However, they are based on a design concept different from that of the conventional spherical aberration corrector using two three-fold symmetric fields such as disclosed in H. Rose, *Optik*, Vol. 85 (1990), pp. 19-24. Therefore, these correctors are complex to adjust because there is a need to search for new set values such as excitation currents and the dimensions of the hexapole elements.

SUMMARY OF THE INVENTION

In view of the foregoing problem, it is an object of the present invention to provide a spherical aberration corrector which is for use in a charged particle beam instrument, is easy to design, and is capable of correcting even six-fold astigmatism. It is another object to provide a method of spherical aberration correction implemented by this spherical aberration corrector.

A first aspect of the present invention provides a spherical aberration corrector which is for use in a charged particle beam instrument and which has a first pair of multipole elements for producing a first pair of three-fold symmetric fields in which three-fold astigmatisms produced mutually are canceled out, and a second pair of multipole elements located behind the first pair of multipole elements. The second pair of multipole elements produces a second pair of three-fold symmetric fields in which three-fold astigmatisms produced mutually are canceled out. Six-fold astigmatisms produced by the second pair of multipole elements are angularly spaced by 30° about an optical axis from six-fold astigmatisms produced by the first pair of multipole elements.

A second aspect of the invention provides a spherical aberration corrector which is for use in a charged particle beam instrument and which has a first pair of multipole elements for producing a first pair of three-fold symmetric fields in which three-fold astigmatisms produced mutually are canceled out, a second pair of multipole elements located behind the first pair of multipole elements, and a rotation lens located between the first pair of multipole elements and the second pair of multipole elements. The second pair of multipole elements produces a second pair of three-fold symmetric fields in which three-fold astigmatisms produced mutually are canceled out. The rotation lens rotates a charged particle beam passed through the first pair of multipole elements such that six-fold astigmatisms produced by the second pair of multipole elements are angularly spaced by 30° about an optical axis from six-fold astigmatisms produced by the first pair of multipole elements.

A third aspect of the invention provides a spherical aberration corrector which is for use in a charged particle beam instrument and which has a first pair of multipole elements for producing a first pair of three-fold symmetric fields in which three-fold astigmatisms produced mutually are canceled out, a second pair of multipole elements located behind the first pair of multipole elements, and a rotating mechanism located between the first pair of multipole elements and the second pair of multipole elements. The second pair of multipole elements produces a second pair of three-fold symmetric fields in which three-fold astigmatisms produced mutually are canceled out. The rotating mechanism rotates at least one pair of the multipole elements of the first and second pairs such that six-fold astigmatisms produced by the second pair of multipole elements are angularly spaced by 30° about an optical axis from six-fold astigmatisms produced by the first pair of multipole elements.

Preferably, a spherical aberration corrector associated with any one of the first through third aspects further comprises pairs of transfer lenses mounted between successive ones of the multipole elements. The transfer lenses of each pair form a first image conjugate with a second image formed in one of the multipole elements adjacent to the transfer lenses of the pair such that the first image is located in the other multipole element.

Preferably, the spherical aberration corrector further comprises a pair of transfer lenses which is mounted between an objective lens and one of the multipole elements closest to the objective lens and which forms a first image conjugate with a second image formed in the multipole element closest to the objective lens such that the first image is located in a coma-free plane of the objective lens.

Preferably, each of the multipole elements is a hexapole element or a dodecapole (12-pole) element. In a spherical aberration corrector associated with any one of the first through third aspects, each one pair of three-fold symmetric fields of the first and second pairs is preferably any one of (a) a pair of magnetostatic fields, (b) a pair of electrostatic fields, and (c) a superimposition of a pair of magnetostatic fields and a pair of electrostatic fields.

A fourth aspect of the present invention provides a method of correcting spherical aberration in a charged particle beam instrument. This method starts with producing a first pair of three-fold symmetric fields in which three-fold astigmatisms produced mutually are canceled out. A second pair of three-fold symmetric fields in which three-fold astigmatisms produced mutually are canceled out is formed behind the first pair of three-fold symmetric fields. Six-fold astigmatisms produced by the second pair of three-fold symmetric fields are angularly spaced by 30° about an optical axis from six-fold astigmatisms produced by the first pair of three-fold symmetric fields.

A fifth aspect of the present invention provides a method of correcting spherical aberration in a charged particle beam instrument. This method starts with producing a first pair of three-fold symmetric fields in which three-fold astigmatisms produced mutually are canceled out. A second pair of three-fold symmetric fields in which three-fold astigmatisms produced mutually are canceled out is produced behind the first pair of three-fold symmetric fields. A charged particle beam passed through the first pair of multipole elements is rotated such that six-fold astigmatisms in the second pair of three-fold symmetric fields are angularly spaced by 30° about an optical axis from six-fold astigmatisms in the first pair of the three-fold symmetric fields.

Preferably, a method of correcting spherical aberration in a charged particle beam instrument in accordance with the fourth or fifth aspect further comprises the step of producing a field between any two adjacent ones of the three-fold symmetric fields to form a first image conjugate with a second image formed in one of the two three-fold symmetric fields such that the first image is located in the other three-fold symmetric field.

The method of spherical aberration correction preferably further comprises the step of producing a field between an objective lens and one of the three-fold symmetric fields which is closest to the objective lens to form a first image conjugate with a second image formed in the three-fold symmetric field closest to the objective lens such that the first image is located in a coma-free plane of the objective lens.

In the method of spherical aberration correction, each one pair of the three-fold symmetric fields of the first and second pairs is preferably any one of (a) a pair of magnetostatic fields, (b) a pair of electrostatic fields, and (c) a superimposition of a pair of magnetostatic fields and a pair of electrostatic fields.

Each one pair of multipole elements of the first and second pairs produces negative spherical aberrations and cancels six-fold astigmatisms produced mutually. At this time, in each pair of multipole elements, three-fold astigmatisms are also canceled out. Consequently, positive spherical aberration in the objective lens can be corrected while removing the three-fold astigmatisms and six-fold astigmatisms. Hence, the spatial resolution of the charged particle beam instrument is improved.

Because the inventive spherical aberration corrector employs a configuration equivalent to two stages of spherical aberration correctors each using a pair of multipole elements, it is possible that the operation, geometry, dimensions, and so on of a spherical aberration corrector using only a single pair of multipole elements can be used as references. In consequence, the development costs can be reduced.

Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

The preferred embodiments of the present invention are hereinafter described with reference to the drawings. Examples in which the spherical aberration corrector of the present embodiment is equipped in a scanning transmission electron microscope (STEM) are described below. The corrector can also be equipped in a scanning electron microscope (SEM), a transmission electron microscope (TEM), a focused ion beam (FIB) system, or other charged particle beam instrument. Similarly, the spherical aberration correction method of the present invention can be applied to any of the above-described charged particle beam instruments, as well as to a transmission electron microscope.

Figure 1:
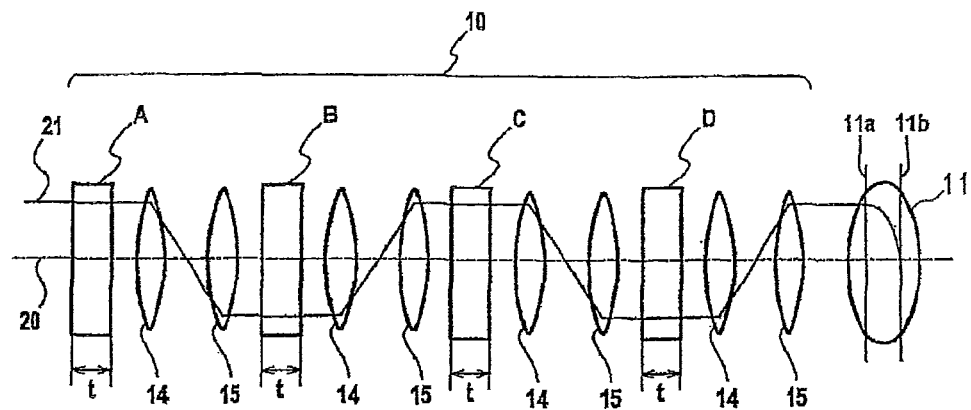
FIG. 1 is a schematic representation of a spherical aberration corrector associated with one embodiment of the present invention.

FIG. 1 is a schematic diagram of a spherical aberration corrector 10 of the present embodiment. The corrector 10 is mounted as an illumination-side aberration correction optical system ahead of an objective lens 11 or as a projector-side aberration correction optical system behind the objective lens 11. FIG. 1 shows an example in which the spherical aberration corrector 10 is mounted as the illumination-side aberration correction optical system. The corrector 10 has a pair of multipole elements A and B for producing a first pair of three-fold symmetric fields that are symmetrical with respect to an optical axis 20, another pair of multipole elements C and D mounted behind the pair of multipole elements A and B. The multipole elements C and C produce a second pair of three-fold symmetric fields that are symmetrical with respect to the optical axis 20. That is, in the present embodiment, the four stages of multipole elements A, B, C, and D are arranged in a row along the optical axis 20. Each individual multipole element produces a three-fold symmetric field. Each of the multipole elements A-D is a hexapole element or a dodecapole (12-pole) element producing any one of a magnetostatic field of three-fold symmetry, an electrostatic field of three-fold symmetry, and a superimposition of such a magnetostatic field and such a electrostatic field.

As shown in FIG. 1, each of the multipole elements A-D has a thickness of t along the optical axis 20. The multipole elements may be different from each other in thickness t. A three-fold symmetric field produced by each multipole element is referred to as a primary term of the field produced by the multipole element. Generally, a multipole element produces weak fields owing to higher-order terms other than the primary term. In a normal (so-called thin) multipole element having almost no thickness, fields owing to higher-order terms other than the primary term are neglected for the intended purpose of the multipole element or merely are parasitic factors. However, if the thickness of the multipole element is increased, the effects of higher-order terms other than the primary term manifest themselves. These effects can be used for correction of chromatic aberration. That is, each multipole element having the thickness t along the optical axis 20 and built in accordance with the present embodiment produces fields owing to higher-order terms (other than the primary term) applicable to correction of chromatic aberration.

As shown in FIG. 1, the spherical aberration corrector 10 of the present embodiment preferably has a pair of transfer lenses 14 and 15 between any two adjacent ones of the multipole elements (i.e., between the multipole elements A and B, between the multipole elements B and C, and between the multipole elements C and D). Transfer lenses 14 and 15 of each pair form an image conjugate with an image formed in one of the two multipole elements adjacent to this pair of transfer lenses 14 and 15 such that the image is located in the other multipole element. The magnification of one pair of transfer lenses 14 and 15 is −1. In other words, with respect to one multipole element A or C of the two adjacent multipole elements A and B (or C and D), the principal plane is located at the focal point on the object side of the transfer lens 14, while the principal plane of the other multipole element B or D is located at the focal point on the image side of the transfer lens 15.

Referring still to FIG. 1, transfer lenses 14 and 15 of a further pair are preferably mounted between the objective lens 11 and one (multipole element D in the example shown in FIG. 1) of the multipole elements A-D closest to the objective lens 11. The transfer lenses 14 and 15 of this pair form a first image conjugate with a second image formed in the multipole element D such that the first image is located in a coma-free plane 11a of the objective lens 11. The coma-free plane 11a is substantially identical with the front focal plane of the objective lens 11. An electron beam 21 incident on the coma-free plane 11a is focused onto a surface 11b of a sample.

The multipole elements A and B produce a pair of three-fold symmetric fields, which in turn produces negative spherical aberrations in two mutually perpendicular directions that are perpendicular to the optical axis 20. Accordingly, the negative spherical aberrations reduce the positive spherical aberration of the objective lens. The multipole elements A and B produce three-fold astigmatisms which are opposite in sense but identical in magnitude. Therefore, the three-fold astigmatism produced by the multipole element A is canceled out by the three-fold astigmatism produced by the multipole element B.

The pair of three-fold symmetric fields produced by the multipole elements A and B cancels the three-fold astigmatisms but induce a six-fold astigmatism that is a fifth-order aberration, which has been a problem with the conventional spherical aberration corrector.

Figure 2:
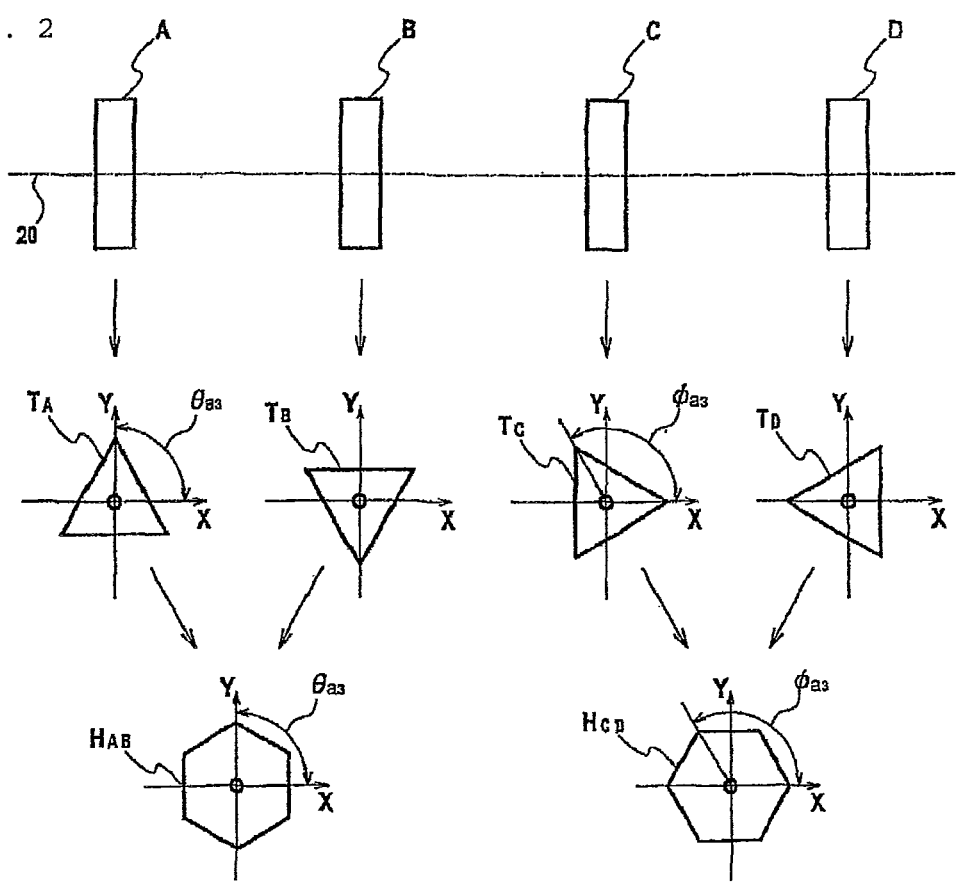
FIG. 2 illustrates one example of angular positional relation between three-fold astigmatisms and six-fold astigmatisms in the spherical aberration corrector shown in FIG. 1.

This six-fold astigmatism is described in detail. A three-fold astigmatism coefficient per unit length of each of the multipole elements A and B (hereinafter simply referred to as the three-fold astigmatism coefficient) is given by $$A_3 = a_3 \exp(3i\theta_{a3}) \qquad (1)$$

where $a_3$ is a constant and $\theta_{a3}$ is an angle (azimuthal angle) indicating a certain azimuth (e.g., the direction in which the three-fold astigmatism appears most strongly) of a three-fold aberration coefficient relative to a certain direction (e.g., the X-axis direction perpendicular to the optical axis 20) (see FIG. 2). On the other hand, using the three-fold astigmatism coefficient $A_3$, a six-fold astigmatism coefficient per unit length of each of the multipole elements A and B (hereinafter simply referred to as the six-fold astigmatism coefficient) is given by $$A_{6\_AB} = \frac{A_3^2 |A_3|^2}{14 M^6 f^6} t^7 \quad (2)$$

where t is the thickness of each of the multipole elements A and B taken along the optical axis 20, M is the demagnification factor of the objective lens 11 (i.e., the ratio in size of the image in the coma-free plane of the objective lens to the image in the principal plane of the multipole element A or B), and f is the focal distance of the objective lens. With respect to the six-fold astigmatism coefficient $A_{6\_AB}$, substituting Eq. (1) into Eq. (2) results in a relationship given by $$A_{6\_AB} \propto (a_3)^4 \exp(6i\theta_{a3}) \quad (3)$$

Therefore, an image created by an electron beam passed through the multipole elements A and B contains six-fold astigmatism.

On the other hand, the multipole elements C and D are similar in fundamental function with the multipole elements A and B. The multipole elements C and D produce a pair of three-fold symmetric fields for giving rise to negative spherical aberrations in two mutually perpendicular directions that are perpendicular to the optical axis 20. Furthermore, the multipole elements C and D produce three-fold astigmatisms which are opposite in sense but identical in magnitude. Accordingly, the three-fold astigmatism in the multipole element C is canceled out by the three-fold astigmatism in the multipole element D, in the same way as for the multipole elements A and B. In return, six-fold astigmatism is produced. Note that the azimuths of the three-fold astigmatisms produced by the multipole elements C and D, respectively, are angularly shifted by 30° about the optical axis 20 from the azimuths produced by the multipole elements A and B. Their magnitudes are equal to the magnitudes of the astigmatisms produced by the multipole elements A and B. That is, the six-fold astigmatisms produced by the multipole elements A and B are angularly spaced by 30° about the optical axis 20 from the six-fold astigmatisms produced by the multipole elements C and D. As can be seen from the following equation, the six-fold astigmatisms produced by the multipole elements A and B are canceled out by the six-fold astigmatisms produced by the multipole elements C and D because of this angularly spaced relationship.

That is, an analogy to the manner in which Eq. (3) is derived shows that the six-fold astigmatism coefficient $A_{6\_CD}$ per unit length of one pair of three-fold symmetric fields produced by the multipole elements C and D has a relation given by $$A_{6\_CD} \propto (a_3)^4 \exp(6i\phi_{a3}) \quad (4)$$

where $\phi_{a3}$ is an azimuthal angle relative to the aforementioned certain direction (see FIG. 2).

The total six-fold astigmatism $A_{6\_Total}$ produced by all of the pair of multipole elements A and B and the pair of multipole elements C and D is given by (5)

$$A_{6\_Total} = A_{6\_AB} + A_{6\_CD} \quad (5)$$

Substituting Eqs. (3) and (4) into Eq. (5) results in:

$$A_{6\_Total} = \frac{t^7}{14 M^6 f^6} |A_3|^2 (a_3)^2 (\exp(6i\theta_{a3}) + \exp(6i\phi_{a3})) \quad (6)$$

As described previously, the azimuthal angle $\theta_{a3}$ is angularly shifted by 30° from the azimuthal angle $\phi_{a3}$. Since the relation $\theta_{a3} - \phi_{a3} = 30°$ holds, one can have the following relation from Eq. (6).

$$A_{6\_Total} \propto (\exp(0) + \exp(i\pi)) = 0 \quad (7)$$

It can be seen from Eq. (7) that the six-fold astigmatisms produced by the multipole elements A and B are canceled out by the six-fold astigmatisms produced by the multipole elements C and D.

Examples of the angularly spaced relationship between the above-described three-fold astigmatisms and six-fold astigmatisms are shown in FIG. 2. Triangles $T_A$, $T_B$, $T_C$, and $T_D$ schematically represent the magnitudes of three-fold astigmatisms produced by the multipole elements A, B, C, and D, respectively, within a plane perpendicular to the optical axis 20. Similarly, hexagons $H_{AB}$ and $H_{CD}$ schematically represent the magnitudes of six-fold astigmatisms produced by the pair of multipole elements A and B and the pair of multipole elements C and D within the plane perpendicular to the optical axis 20. It is assumed that the three-fold astigmatism in the multipole element A produces the strongest effect in three directions (including the +Y-axis direction) that are angularly spaced from each other by 120° as indicated by the triangle $T_A$ in FIG. 2. The multipole element B produces three-fold astigmatism that is identical in magnitude but opposite in sense to the three-fold astigmatism produced by the multipole element A. The triangle $T_B$ representing the astigmatism is angularly spaced by 60° from the triangle $T_A$ or obtained by folding the triangle $T_A$ back along the X-axis. The resultant three-fold astigmatism is 0. In return, six-fold astigmatism indicated by the hexagon $H_{AB}$ shown in FIG. 2 appears.

The angularly spaced relationship between the triangles $T_C$ and $T_D$ is similar to the angularly spaced relationship between the triangles $T_A$ and $T_B$. Because the multipole element D produces three-fold astigmatism that is opposite in sense but identical in magnitude to the three-fold astigmatism produced by the multipole element C, the triangle $T_D$ is obtained by rotating the triangle $T_C$ through 60°. However, the triangle $T_D$ can be said to have been folded back along the Y-axis because the difference in azimuthal angles $\theta_{a3}$ and $\phi_{a3}$ between the three-fold astigmatisms produced by the multipole elements A and C is set to 30° and thus the triangle $T_C$ has been rotated through 30° relative to the triangle $T_A$. The resultant three-fold astigmatism is 0. In return, six-fold astigmatism indicated by the hexagon $H_{CD}$ shown in FIG. 2 appears. The hexagon $H_{CD}$ has been rotated through 30° relative to the hexagon $H_{AB}$ because of the difference between the azimuthal angles $\theta_{a3}$ and $\phi_{a3}$.

As can be understood from FIG. 2, the six-fold astigmatisms produced by the pair of multipole elements A and B are angularly shifted by 30° about the optical axis from the six-fold astigmatism produced by the pair of multipole elements C and D. Therefore, as given by Eq. (7), the sum of the six-fold astigmatisms is null. At this time, in each pair of multipole elements, the three-fold astigmatisms are also canceled out. Since the positive spherical aberration in the objective lens can be corrected while removing the three-fold astigmatisms and six-fold astigmatisms, the maximum incidence angle of the electron beam allowed as a probe beam can be enlarged and the diffraction aberration can be reduced in a case where the spherical aberration corrector 10 of the present embodiment is mounted, for example, on the illumination side of an STEM. Consequently, the spatial resolution of the STEM or other charged particle beam instrument can be improved.

The spherical aberration corrector 10 of the present embodiment is configured using two pairs of multipole elements. Spherical aberration correctors using only a single pair of multipole elements are widely known. When the spherical aberration corrector 10 of the present embodiment is designed, the operations, geometries, dimensions, and so on of the known correctors can be used as references. As a consequence, the development costs can be curtailed.

In order to cancel out the six-fold astigmatisms, it suffices that they be identical in magnitude and angularly spaced by 30° from each other about the optical axis. Accordingly, the angularly spaced relationship between the three-fold astigmatisms produced by the pairs of multipole elements A, B, C, D is not restricted to the relation shown in FIG. 2. In particular, the multipole element A may produce three-fold astigmatism as indicated by the triangle $T_B$. The multipole element B may produce three-fold astigmatism as indicated by the triangle $T_A$. The same principle applies to the multipole elements C and D. Furthermore, the three-fold astigmatisms produced by the multipole elements A and B and the three-fold astigmatisms produced by the multipole elements C and D may be interchanged.

Figure 3A:
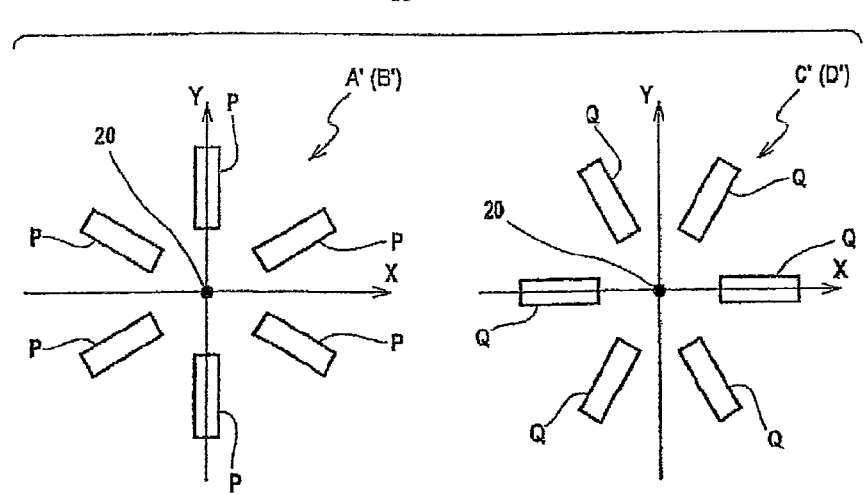
FIG. 3 illustrates arrangements of two pairs of hexapole elements in a spherical aberration corrector associated with one embodiment of the invention, and in which FIG. 3A indicates an arrangement where hexapole elements of a second pair are angularly spaced by 30° about an optical axis from hexapole elements of a first pair and FIG. 3B indicates an arrangement where hexapole elements of two pairs are arranged identically as viewed along the optical axis.

As described previously, each of the multipole elements A, B, C, and D of the present embodiment is a hexapole element or a dodecapole element. Where hexapole elements A', B', C', and D' are used as the multipole elements A, B, C, and D, the poles P of one pair of hexapole elements A' and B' are angularly spaced by 30° about the optical axis 20 from the poles Q of one pair of hexapole elements C' and D' as shown in FIG. 3A in order to obtain an angular spacing of 30° between the six-fold astigmatisms.

Figure 3B:
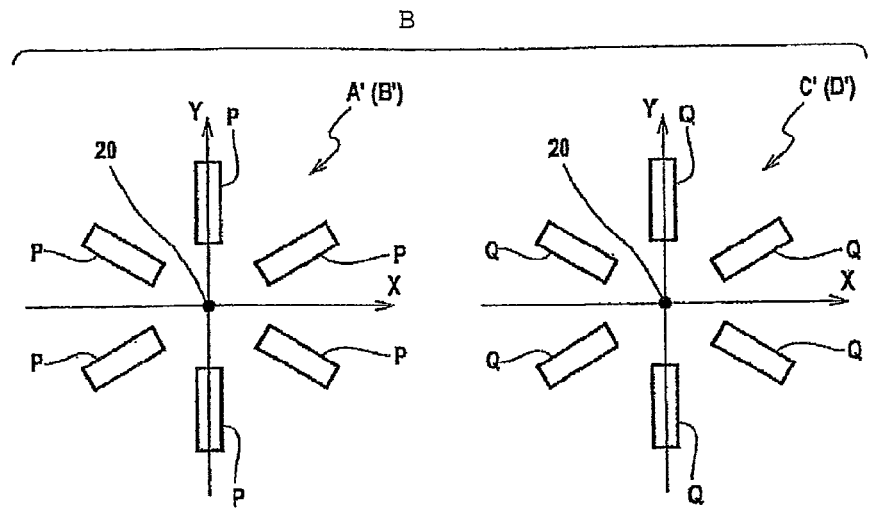
Figure 4:
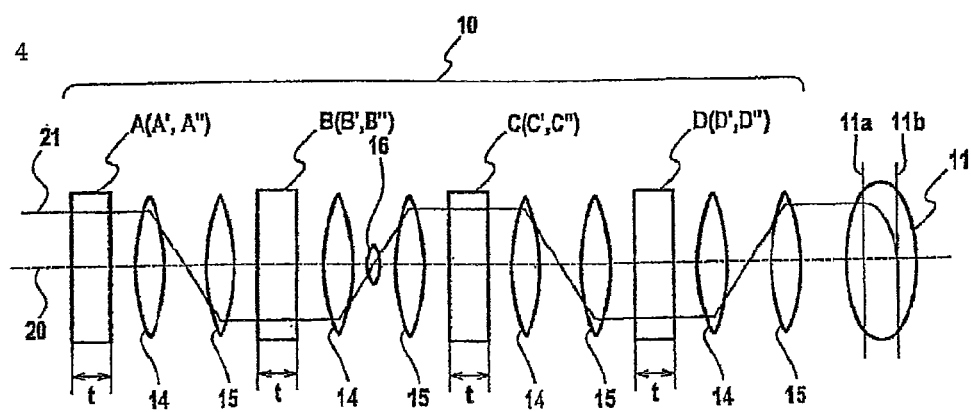
FIG. 4 is a schematic diagram of a spherical aberration corrector associated with one embodiment of the invention, and in which a rotation lens is mounted.
Figure 5:
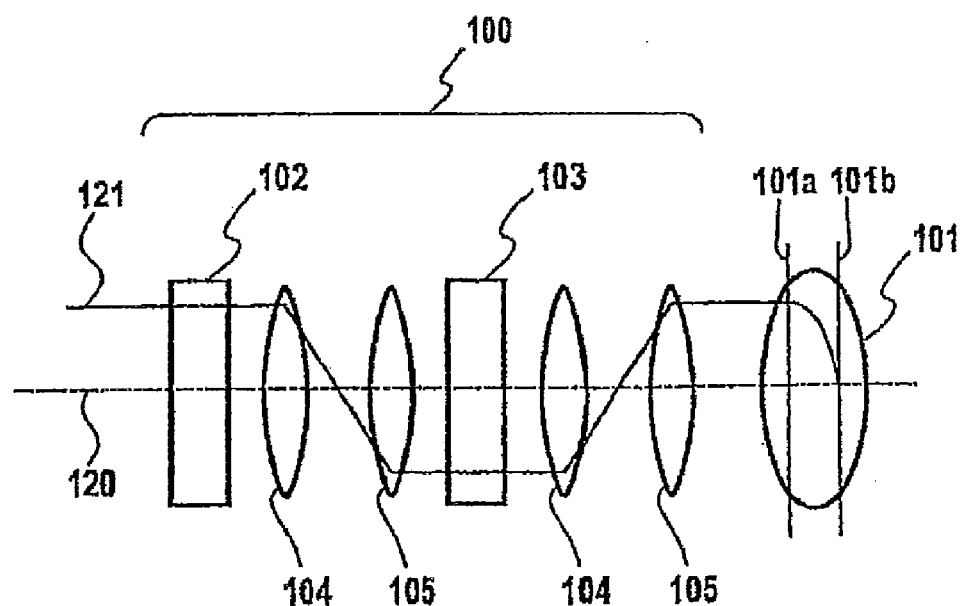
FIG. 5 is a schematic diagram of a conventional spherical aberration corrector.

Alternatively, the poles P of one pair of hexapole elements A' and B' may be arranged to agree with the poles Q of one pair of hexapole elements C' and D' as viewed along the optical axis 20 as shown in FIG. 3B. In this case, a rotation lens 16 for rotating an electron beam 21 (image formed by the hexapole element B') passed through the hexapole element B' through 30° about the optical axis 20 is mounted between the hexapole elements B' and C' as shown in FIG. 4.

Where dodecapole elements A", B", C", and D" are used as the multipole elements A, B, C, and D, respectively, it is desired to mount the rotation lens 16. It is desired that the dodecapole elements A", B", C", and D" be so arranged that their poles are coincident as viewed along the optical axis 20. Therefore, in principle, the above-described angular spacing of 30° is obtained by controlling the polarities of the poles. However, error may be introduced in the angular spacing due to insufficient assembly accuracy. If the rotation lens 16 is mounted, it is possible to compensate for the error.

The spherical aberration corrector 10 of the present embodiment may have a rotation mechanism (not shown) for rotating at least one pair of the multipole elements A and B and the multipole elements C and D. For instance, the above-described angular spacing of 30° is obtained by rotating support members (not shown) holding the multipole elements C and D around the optical axis 20 by means of the rotation mechanism. In this case, a strict positional relationship required between the poles when the pair of multipole elements A and B and the pair of multipole elements C and D are mounted is mitigated and, therefore, the machining costs can be suppressed.

Having thus described my invention with the detail and particularity required by the Patent Laws, what is desired protected by Letters Patent is set forth in the following claims.

The invention claimed is:

1. A spherical aberration corrector for use in a charged particle beam instrument, comprising:
    a first pair of multipole elements for producing a first pair of three-fold symmetric fields in which three-fold astigmatisms produced mutually are canceled out; and
    a second pair of multipole elements located behind the first pair of multipole elements and producing a second pair of three-fold symmetric fields in which three-fold astigmatisms produced mutually are canceled out;
    wherein six-fold astigmatisms in the second pair of multipole elements are angularly spaced by 30° about an optical axis from six-fold astigmatisms in the first pair of multipole elements.

2. A spherical aberration corrector for use in a charged particle beam instrument, comprising:
    a first pair of multipole elements for producing a first pair of three-fold symmetric fields in which three-fold astigmatisms produced mutually are canceled out;
    a second pair of multipole elements located behind the first pair of multipole elements and producing a second pair of three-fold symmetric fields in which three-fold astigmatisms produced mutually are canceled out; and
    a rotation lens mounted between the first pair of multipole elements and the second pair of multipole elements and acting to rotate a charged particle beam passed through the first pair of multipole elements such that six-fold astigmatisms in the second pair of multipole elements are angularly spaced by 30° about an optical axis from six-fold astigmatisms produced by the first pair of multipole elements.

3. A spherical aberration corrector for use in a charged particle beam instrument, comprising:
    a first pair of multipole elements for producing a first pair of three-fold symmetric fields in which three-fold astigmatisms produced mutually are canceled out;
    a second pair of multipole elements located behind the first pair of multipole elements and producing a second pair of three-fold symmetric fields in which three-fold astigmatisms produced mutually are canceled out; and
    a rotation mechanism mounted between the first pair of multipole elements and the second pair of multipole elements and acting to rotate at least one pair of the multipole elements of the first and second pairs such that six-fold astigmatisms produced by the second pair of multipole elements are angularly spaced by 30° about an optical axis from six-fold astigmatisms produced by the first pair of multipole elements.

4. A spherical aberration corrector for use in a charged particle beam instrument as set forth in any one of claims 1 to 3, wherein there are further provided pairs of transfer lenses mounted between successive ones of the multipole elements, and wherein the transfer lenses of each pair form a first image conjugate with a second image formed in one of the multipole elements adjacent to the transfer lenses of the pair such that the first image is located in the other multipole element.

5. A spherical aberration corrector for use in a charged particle beam instrument as set forth in claim 4, further comprising a further pair of transfer lenses mounted between an objective lens and one of the multipole elements closest to the objective lens and acting to form a first image conjugate with a second image formed in the multipole element closest to the objective lens such that the first image is located in a coma-free plane of the objective lens.

6. A spherical aberration corrector for use in a charged particle beam instrument as set forth in any one of claims 1 to 3, wherein each of said multipole elements is a hexapole element.

7. A spherical aberration corrector for use in a particle beam instrument as set forth in any one of claims 1 to 3, wherein each of said multipole elements is a dodecapole element.

8. A spherical aberration corrector for use in a charged particle beam instrument as set forth in any one of claims 1 to 3, wherein each one pair of the three-fold symmetric fields of the first and second pairs is any one of a pair of magnetostatic fields, a pair of electrostatic fields, and a superimposition of a pair of magnetostatic fields and a pair of electrostatic fields.

9. A method of correcting spherical aberration in a charged particle beam instrument, comprising the steps of:
   producing a first pair of three-fold symmetric fields in which three-fold astigmatisms produced mutually are canceled out; and
   producing a second pair of three-fold symmetric fields in which three-fold astigmatisms produced mutually are canceled out, the second pair of three-fold symmetric fields being located behind the first pair of three-fold symmetric fields;
   wherein six-fold astigmatisms produced by the second pair of three-fold symmetric fields are angularly spaced by 30° about an optical axis from six-fold astigmatisms produced by the first pair of three-fold symmetric fields.

10. A method of correcting spherical aberration in a charged particle beam instrument, comprising the steps of:
   producing a first pair of three-fold symmetric fields in which three-fold astigmatisms produced mutually are canceled out;
   producing a second pair of three-fold symmetric fields in which three-fold astigmatisms produced mutually are canceled out, the second pair of three-fold symmetric fields being located behind the first pair of three-fold symmetric fields; and
   rotating a charged particle beam passed through the first pair of multipole elements ahead of the second pair of three-fold symmetric fields such that six-fold astigmatisms in the second pair of multipole elements are angularly spaced by 30° about an optical axis from six-fold astigmatisms in the first pair of multipole elements.

11. A method of correcting spherical aberration in a charged particle beam instrument as set forth in any one of claim 9 or 10, further comprising the step of producing a field between any two adjacent ones of the three-fold symmetric fields to form a first image conjugate with a second image formed in one of the two three-fold symmetric fields such that the first image is located in the other three-fold symmetric field.

12. A method of correcting spherical aberration in a charged particle beam instrument as set forth in claim 11, further comprising the step of producing a field between an objective lens and one of the three-fold symmetric fields which is closest to the objective lens to form a first image conjugate with a second image formed in the three-fold symmetric field closest to the objective lens such that the first image is located in a coma-free plane of the objective lens.

13. A method of correcting spherical aberration in a charged particle beam instrument as set forth in any one of claim 9 or 10, wherein each one pair of the three-fold symmetric fields of the first and second pairs is any one of a pair of magnetostatic fields, a pair of electrostatic fields, and a superimposition of a pair of magnetostatic fields and a pair of electrostatic fields.

* * * * *